(12) United States Patent
Gardner et al.

(10) Patent No.: US 6,309,936 B1
(45) Date of Patent: Oct. 30, 2001

(54) INTEGRATED FORMATION OF LDD AND NON-LDD SEMICONDUCTOR DEVICES

(75) Inventors: Mark I. Gardner, Cedar Creek; Robert Paiz, Austin; Thomas E. Spikes, Jr., Round Rock, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/163,965

(22) Filed: Sep. 30, 1998

(51) Int. Cl.[7] ................................................ H01L 21/336
(52) U.S. Cl. .................... 438/305; 438/231; 438/291; 438/303
(58) Field of Search ..................................... 438/157, 153, 438/156, 158, 596, 405, 409, 305, 231, 291, 303, 217; 257/329, 262, 283, 347, 507, 510, 383, 384, 385, 387

(56) References Cited

U.S. PATENT DOCUMENTS

| | | | |
|---|---|---|---|
| 4,852,062 | * 7/1989 | Baker et al. | 365/185 |
| 5,158,898 | * 10/1992 | Hayden et al. | 437/21 |
| 5,235,189 | * 8/1993 | Hayden et al. | 257/329 |
| 5,395,778 | * 3/1995 | Walker | 437/43 |
| 5,397,909 | * 3/1995 | Moslehi | 257/383 |
| 5,716,861 | * 2/1998 | Moslehi | 437/20 |
| 5,736,437 | * 4/1998 | Dennison et al. | 438/157 |
| 5,759,901 | * 6/1998 | Loh et al. | 438/305 |

OTHER PUBLICATIONS

Nov. 11, 1999, Wolf, *Silicon Processing for the VLSI Era*, vol. 3, pp. 608–630, Lattice Press (1995).

* cited by examiner

*Primary Examiner*—Charles Bowers
*Assistant Examiner*—Laura M Schillinger

(57) ABSTRACT

A method of forming a semiconductor device includes forming a first gate electrode over a substrate and then forming a spacer on at least one sidewall of the first gate electrode. A second gate electrode is formed over the substrate after forming the spacer. A first dopant is implanted into the substrate to form a first heavily doped active region adjacent to the spacer and spaced from the first gate electrode and a second heavily doped active region adjacent to the second gate electrode. The spacer is then removed and a second dopant is implanted into the substrate to form a lightly doped active region adjacent to the first gate electrode. In some instances, gate dielectrics for the first and second gate electrodes are formed using different materials and/or having different thicknesses.

25 Claims, 13 Drawing Sheets

US 6,309,936 B1

INTEGRATED FORMATION OF LDD AND NON-LDD SEMICONDUCTOR DEVICES

FIELD OF THE INVENTION

The present invention is directed to semiconductor devices and methods of making these devices, and more particularly, semiconductor devices with LDD and Non-LDD MOS structures and methods of making these devices.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel region 107 is typically lightly doped with a dopant of a type opposite to that of the source/drain regions 105. In addition, the channel may be doped with a voltage threshold implant to alter the characteristics of the channel region. A punchthrough region may also be formed beneath the channel region 107 to prevent or reduce current leakage. The punchthrough region is typically moderately doped with a dopant of a type opposite to that of the source/drain regions 105.

The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD source/drain structure includes a lightly-doped, lower conductivity region 106 near the channel region 107 and a heavily-doped, higher conductivity region 104 adjacent to the lower conductivity region 106 and typically connected to a source/drain terminal. Generally, the LDD source/drain structures are formed by implanting a first dopant into active regions adjacent the gate electrode 103 at relatively low concentration levels to form the lightly-doped regions 106; forming spacers 102 on sidewalls of the gate electrode 103; and implanting a second dopant into the active regions at higher concentration levels to form the heavily-doped regions 104. The substrate is typically annealed to drive the dopant in the heavily-doped regions deeper into the substrate 101.

Other types of semiconductor devices include source/drain regions without a lightly-doped region adjacent to the channel. These types of source/drain regions, referred to herein as non-LDD source/drain structures, are typically characterized as being relatively heavily doped throughout.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET). Semiconductor devices, like the one described above, are used in large numbers to construct most modern electronic devices.

In many instances, it may be useful to generate a variety of different MOS structures on a single substrate. For example, it may be desirable to form one or more active devices (e.g., transistors) with LDD source/drain structures and one or more active devices (e.g., transistors) with non-LDD source/drain structures on a common substrate. It may also be desirable to form active devices with different gate dielectrics. There is a need for the development of processes for forming semiconductor devices with different MOS structures on a single substrate.

SUMMARY OF THE INVENTION

The present invention provides techniques for forming active devices with LDD source/drain structures and active device with non-LDD source/drain structures and/or devices with different gate dielectrics on a single substrate and in an integrated manner. One embodiment is a method of forming a semiconductor device. A first gate electrode is formed over a substrate and then a spacer is formed on at least one sidewall of the first gate electrode. A second gate electrode is formed over the substrate after forming the spacer. A first dopant is implanted into the substrate to form a first heavily doped active region adjacent to the spacer and spaced from the first gate electrode and a second heavily doped active region adjacent to the second gate electrode. The spacer is then removed and a second dopant is implanted into the substrate to form a lightly doped active region adjacent to the first gate electrode. In some instances, gate dielectrics formed between the first and second gate electrodes are made of different materials and/or have different thicknesses.

Another embodiment of the invention is another method of forming a semiconductor device. A first dielectric layer is formed over a substrate and a first gate electrode is formed over a region of the first dielectric layer. A spacer is formed on at least one sidewall of the first gate electrode. At least a portion of the first dielectric layer over a substrate region apart from the first gate electrode is removed and then a second dielectric layer is formed over the substrate region after forming the spacer. A second gate electrode is formed over the second dielectric layer.

Yet another embodiment is a semiconductor device formed on a substrate. The device includes a first gate electrode disposed over the substrate and a first dielectric layer disposed between the first gate electrode and the substrate. A first doped source/drain region is formed in the substrate adjacent to the first gate electrode and includes a lightly doped active region adjacent to the first gate electrode and a heavily doped active region adjacent to the lightly doped active region. The device also includes a second gate electrode disposed over the substrate and a second dielectric layer, different from the first dielectric layer, disposed between the second gate electrode and the substrate. A second doped source/drain region is formed in the substrate and includes a heavily doped active region adjacent to the second gate electrode.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
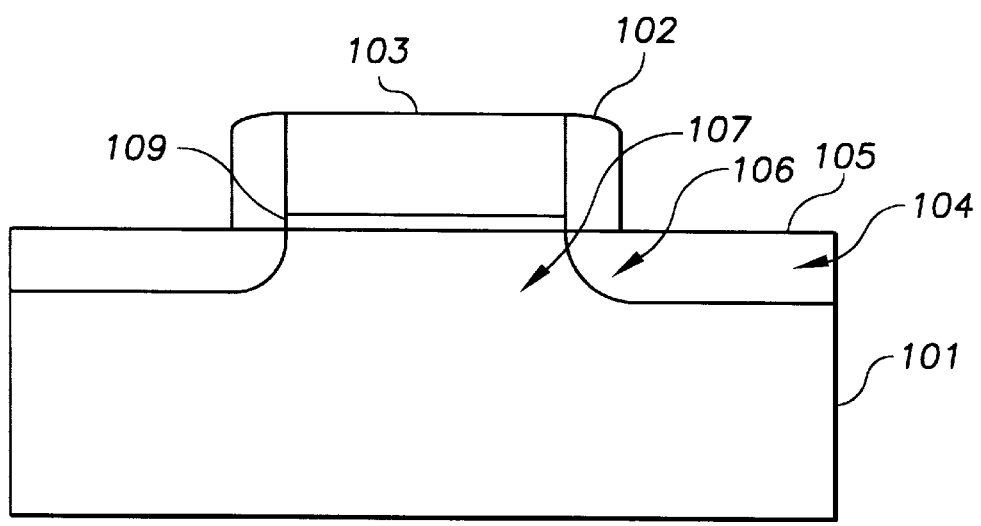
FIG. 1 illustrates a conventional MOS device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to integrated formation of semiconductor devices having MOS structures with different characteristics. The invention is particularly suited for the formation of active devices with LDD source/drain structures and active devices with non-LDD structures and/or active devices with different gate dielectrics in an integrated manner. While the present invention is not so limited, an appreciation of various aspects of the invention will be gained through a discussion of the various application examples operating in such environments.

Figure 2A:
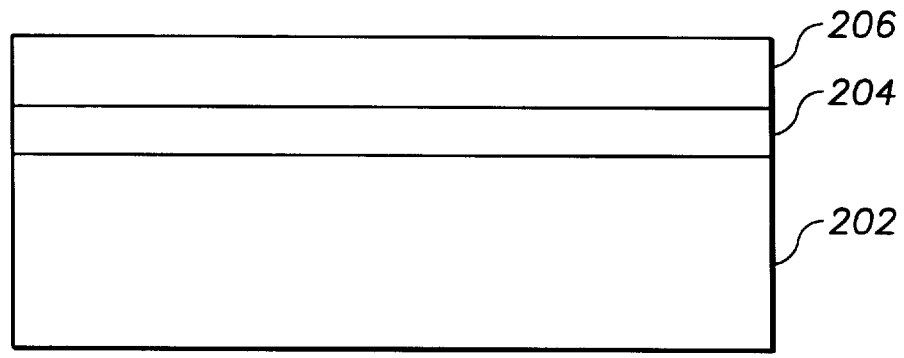
FIGS. 2A–2H illustrate an exemplary process for making a semiconductor device according to the invention.

FIGS. 2A through 2H illustrate an exemplary process for forming a semiconductor device. A first dielectric layer 204, for use as a gate insulating layer, is formed on a substrate 202, as shown in FIG. 2A. The substrate 202 is typically a semiconductor material, such as, for example, silicon. The first dielectric layer 204 can include dielectric materials, such as, for example, silicon dioxide, silicon nitride, silicon oxynitride, or nitrided silicon oxide ($SiO_xN_y$). In some embodiments, the first dielectric layer 204 is formed using one or more materials that have a dielectric constant greater than silicon dioxide (approximately 4.2). Such high-K dielectric materials often have a dielectric constant of 8 or greater, for example, ranging from 8 to 500 or greater. Examples of suitable high-K dielectric materials and their approximate dielectric constants include $TiO_2$ (dielectric constant of 86), lead lanthanum zirconate titanate (PLZT, dielectric constant of 29), $Ta_2O_5$ (dielectric constant of 50), and other non-conducting metal oxides.

The first dielectric layer 204 can be formed by a variety of processes, including, for example, chemical vapor deposition, physical vapor deposition, thermal oxidation of the substrate, or spin-on glass formation. For high-K dielectric materials, the first dielectric layer 204 can have a thickness ranging from, for example, 10 to 100 Angstroms, although, a thicker or thinner first dielectric layer may also be used. The thickness of the first dielectric layer 204 is typically selected in consideration of the capacitive characteristics of the layer, taking into account any reliability concerns.

A first gate electrode layer 206 is formed over the first dielectric layer 204, as shown in FIG. 2A. The first gate electrode layer 206 can be formed from a variety of conductive materials, such as, for example, polysilicon, a metal (such as, for example, copper, titanium, tungsten, aluminum, iridium, or cobalt), or a metallic compound (such as, for example, tungsten nitride or titanium nitride). The first gate electrode layer 206 can be formed by a variety of techniques, including, for example, chemical vapor deposition or physical vapor deposition.

Figure 2B:
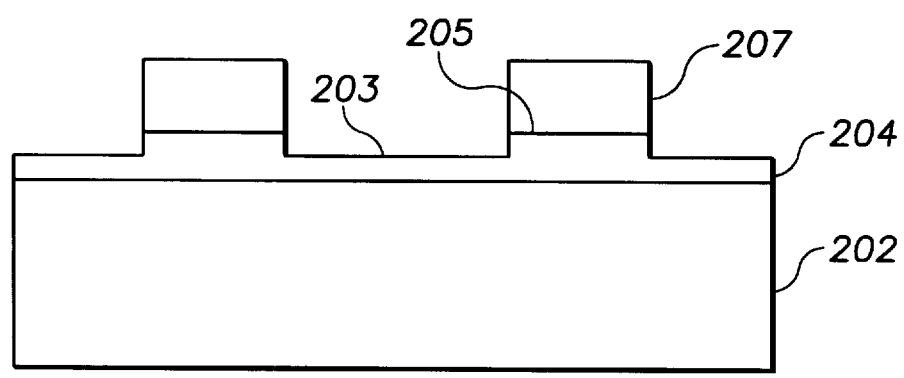

The first gate electrode layer 206 is patterned into one or more first gate electrodes 207, as shown in FIG. 2B. This can be accomplished using photolithographic techniques, including, for example, depositing a photoresist material over the first gate electrode layer 206, patterning the photoresist using a mask, and simultaneously or sequentially removing portions of the photoresist and the gate electrode layer 206 according to the pattern to form the first gate electrodes 207. The portions of the first gate electrode layer 206 can be removed by a variety of methods including, for example, etching, such as, anisotropic etching. Anisotropic etching typically results in structures having relatively vertical sidewalls.

A portion of the first dielectric layer 204 between the first gate electrodes 207 is also removed simultaneously with or subsequent to the formation of the first gate electrodes 207, as shown in FIG. 2B. The removal of this portion of the first dielectric layer 204 can be accomplished by a variety of techniques, including, for example, etching, particularly, anisotropic etching. The removal of this material leaves thinner regions 203 of the first dielectric layer 204 with thicker regions 205 remaining beneath the first gate electrodes 207. The thinner regions 203 of the first dielectric layer 204 can be used, at least in part, as a gate insulating layer for one or more gate electrodes. The amount of material removed to form the thinner regions 203 is typically selected in consideration of the desired capacitive characteristics of the thinner regions. The amount of the first dielectric layer 204 that is removed can range from, for example, 25 to 50% of the initial thickness of the first dielectric layer 204, although larger or smaller amounts can also be removed.

Figure 2C:
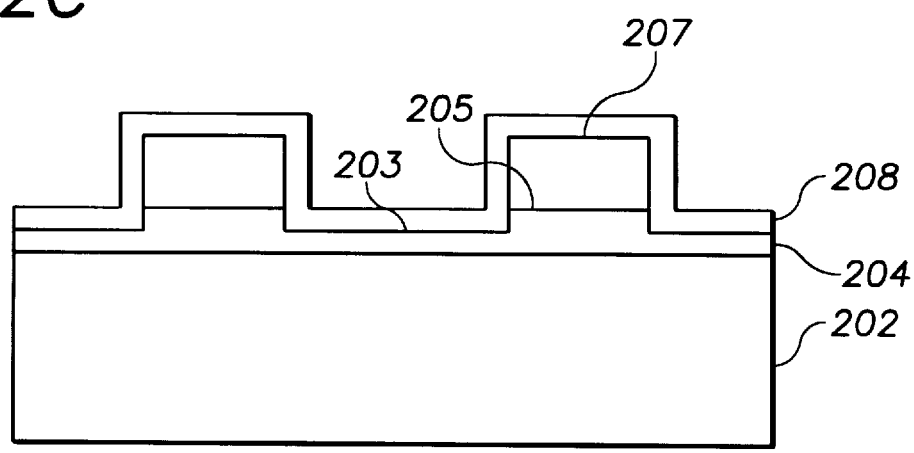

A spacer layer 208 is formed over the first dielectric layer 204 and the first gate electrodes 207, as shown in FIG. 2C. The spacer layer 208 is typically formed using a dielectric material, although other materials may also be used. Suitable materials, include, for example, silicon dioxide, silicon nitride, silicon oxynitride, or nitrided silicon oxide ($SiO_xN_y$). Typically, the spacer layer 208 is formed by a conformal deposition of the material, such as, for example, chemical vapor deposition of the dielectric material. However, other techniques, including, for example, physical vapor deposition and thermal oxidation of the first gate electrodes 207 (if formed of polysilicon) may also be used.

Figure 2D:
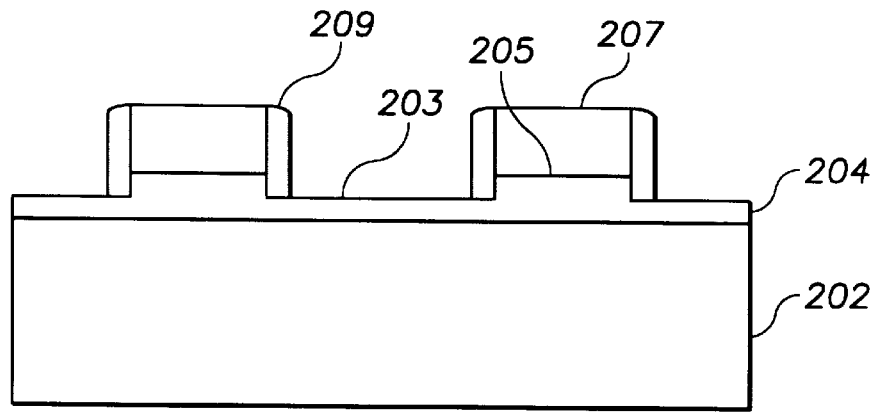

A portion of the spacer layer 208 is removed to form spacers 209 on the sidewalls of the first gate electrodes 207, as shown in FIG. 2D. The spacers 209 can be formed by, for example, anisotropically etching the spacer layer 208. Anisotropic etching can remove the laterally extending portions of the spacer layer 208 on the top of and between the first gate electrodes 207, while retaining the vertically extending portions on the sidewalls of the first gate electrodes 207. The anisotropic etching process may also be selective to the material of the spacer layer 208 to prevent or reduce etching of the first gate electrodes 207 and first dielectric layer 203. In some instances, the first gate electrodes 207 and/or the first dielectric layer 203 can be used as etch stops during the formation of the spacers 209.

The spacers 209 are often used to space a heavily-doped region from the first gate electrode 207 and to cover a portion of the substrate 201 in which a lightly-doped region is formed. The thickness of the spacers 209 is suitably selected in consideration of the desired spacing of a heavily-doped region from the first gate electrode 207 and the desired width of the lightly-doped region. Suitable thicknesses of the spacers can range from, for example, 100 to 500 angstroms.

Figure 2E:
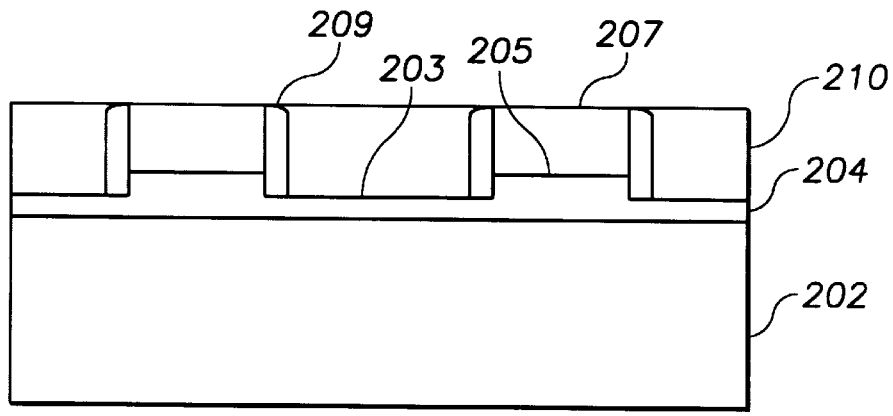

A second gate electrode layer 210 is formed between the first gate electrodes 207, as shown in FIG. 2E. The second gate electrode layer 210 can be formed from a variety of conductive materials, such as, for example, polysilicon, a metal (such as, for example, copper, titanium, tungsten, aluminum, iridium, or cobalt), or metallic compounds (such as, for example, tungsten nitride or titanium nitride). The first and second gate electrode layers 206, 210 may or may not be formed of the same material.

The second gate electrode layer 210 can be formed by a variety of techniques, including, for example, chemical vapor deposition or physical vapor deposition. In one embodiment, a portion of the second gate electrode layer 210 is formed over the first gate electrodes 207. This portion of the second gate electrode layer 210 can be removed using planarization techniques, including, for example, chemical, mechanical, or chemical/mechanical polishing. Often, the second gate electrode layer 210 is planarized to be level with the top surface of the first gate electrodes 207, as illustrated in FIG. 2E.

Figure 2F:
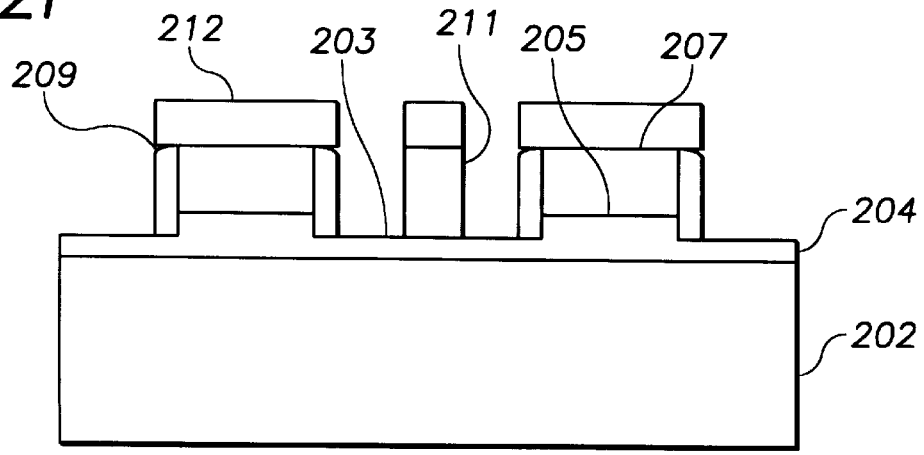

A photoresist material 212 is deposited over the first gate electrodes 207 and the second gate electrode layer 210. The photoresist material 212 is then patterned and underlying portions of the second gate electrode layer 210 are removed to form one or more second gate electrodes 211, as shown in FIG. 2F. The photoresist material 212 can typically be any known photoresist material that is altered by exposure to light of a particular wavelength. Patterning of the photoresist material 212 can be performed by known photolithographic techniques.

Portions of the second gate electrode layer 210 can be removed using a variety of techniques, including anisotropic etching. In some embodiments, an anisotropic etchant is chosen that selectively etches the material of the second electrode layer 210 without etching the spacers 209 and/or the first gate electrodes 207 (assuming that the material of the first gate electrodes 207 is different than the material of the second gate electrode layer 210). This may be useful if portions of the spacers 209 or first gate electrodes 207 are inadvertently or purposefully exposed during the patterning of the photoresist material 212.

The second gate electrodes 211 differ from the first gate electrodes 207 because there are no spacers around the second gate electrodes 211 and, typically, the thickness or capacitive characteristics of the first dielectric layer 204 between the first and second gate electrodes 207, 211 are different. In addition, at least in some instances, the first and second gate electrodes 207, 211 are formed of different materials. These differences between the first and second gate electrodes 207, 211 typically result in different operational properties for the associated active devices (e.g., transistors). For example, the two different types of devices may have different voltage thresholds or switching speeds. The combination of two different types of transistors may be beneficial in applications, such as, for example, memory or logic devices. Moreover, although the illustrated process flow shows a second gate electrode between two first gate electrodes, it will be understood that other arrangements of first and second gate electrodes can be formed.

Figure 2G:
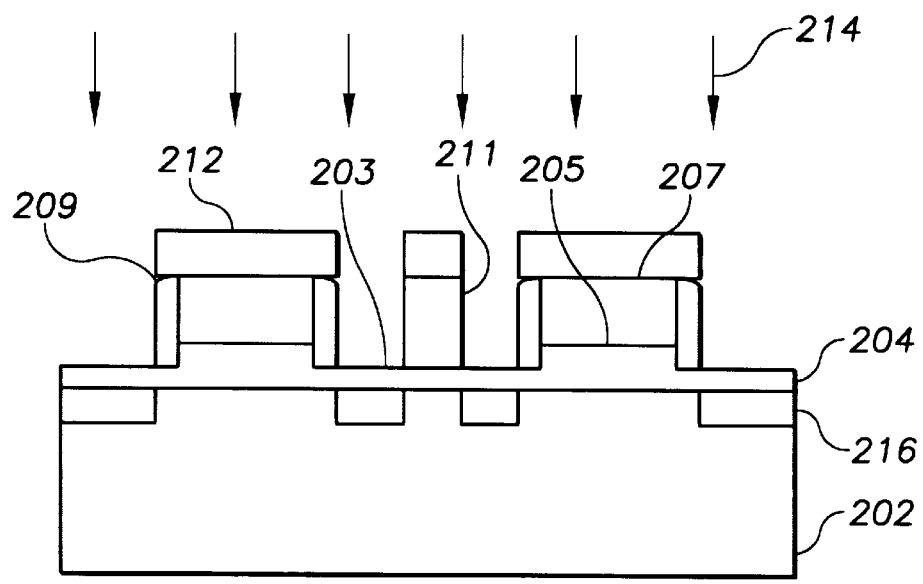

Following the formation of the second gate electrodes 211, the substrate can be doped with a first dopant material 214 to form active regions 216, as shown in FIG. 2G. The first dopant material 214 is typically implanted by ion implantation in the active regions 216 adjacent to the second gate electrodes 211 and the spacers 209 of the first gate electrodes 207. The photoresist material 212 over the first and second gate electrodes 207, 211 may remain, as illustrated, or may be removed.

The first dopant material 214 can be an n-type or a p-type dopant material. Suitable p-type dopant materials include, for example, boron and boron compounds, such as boron hydride or boron halides. Suitable n-type dopant materials include arsenic or phosphorus. Implant energies for the first dopant material 214 range from, for example, 2 to 20 keV and implant concentrations range from, for example, 1E15 (i.e., $1\times10^{15}$) to 9E15 (i.e., $9\times10^{15}$) dopant atoms/cm$^2$.

The partially fabricated device 200 may be annealed using, for example, rapid thermal anneal (RTA) techniques. This activates the dopant material in the active regions 216 and may drive the dopant material deeper into the substrate 202 and provide a more uniform distribution of the dopant material. This may also cause some lateral diffusion of the dopant material. The temperature to which the substrate 202 is heated typically ranges from, for example, 800 to 950° C. for periods of time ranging from, for example, 30 to 60 seconds. This anneal process may be performed at any time in the process after the implantation of the dopant material. However, if the first and/or second gate electrodes 207, 211 are formed using a metal, the temperature and/or duration of the anneal may be modified to prevent or reduce disturbance or damage to the gate electrodes 207, 211.

Figure 2H:
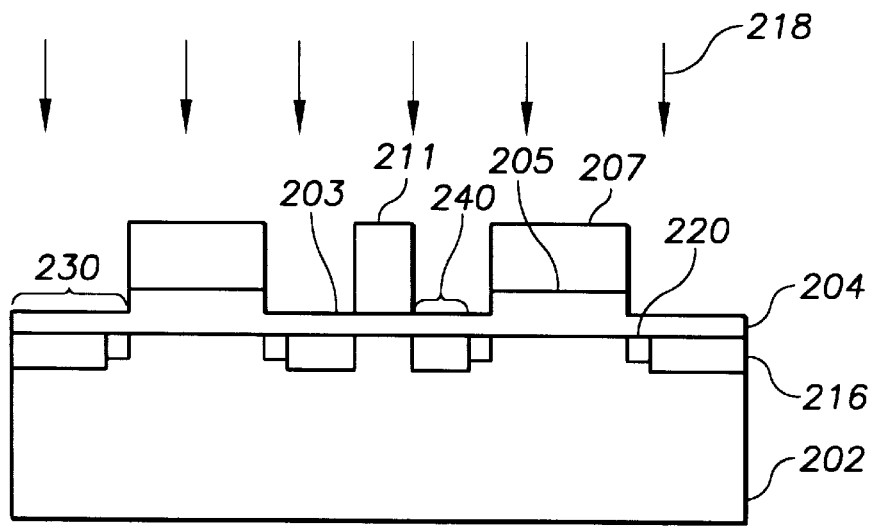

After the formation of the active regions 216, the remaining photoresist material 212, if any, and the spacers 209 around the first gate electrodes 207 are removed, as shown in FIG. 2H. The substrate 202 is doped with a second dopant material 218, typically of the same type (either n-type or p-type) as the first dopant material 214, to form lightly-doped (LDD) regions 220 adjacent to the first gate electrodes 207. In this manner, both active devices with LDD source/drain structures 230 and active devices with non-LDD source/drain structures 240 can be formed on the same substrate and in an integrated process.

Suitable p-type dopant materials include, for example, boron and boron compounds, such as boron hydride or boron halides. Suitable n-type dopant materials include arsenic or phosphorus. Implant energies for the second dopant material 214 range from, for example, 2 to 15 keV and implant concentrations range from, for example, 5E13 (i.e., $5\times10^{13}$) to 8E14 (i.e., $8\times10^{14}$) dopant atoms/cm$^2$.

Fabrication may continue using well-known processing steps including, for example, silicidation, interlayer dielectric formation, interconnect formation, conducting line formation, and so forth to complete the ultimate device structure. The process illustrated in FIGS. 2A through 2H can be adapted for formation of both PMOS and NMOS structures in a CMOS device. In one embodiment, both PMOS and NMOS structures are formed simultaneously except that during the implantation steps one type of structure is masked, for example, by a photoresist material or dielectric material, while the other type of structure is implanted. Both the active regions and LDD regions can be implanted in one type of structure (e.g., NMOS) first and then implanted in the other type of structure (e.g., PMOS). Alternatively, both active regions can be sequentially formed followed by both LDD regions.

In another embodiment, the first gate electrode layer 204 and the first dielectric layer 206 are formed for both the NMOS and PMOS structures, but the process flow illustrated in FIGS. 2B through 2H is performed first for one type of structure (e.g., NMOS) and then the first structures are masked and the second structures (e.g., PMOS) are formed as illustrated in FIGS. 2B through 2H. In this process flow, the first dielectric layer 206 may function as a mask for the second structures (e.g., PMOS) while the first structures (e.g., NMOS) are being formed.

Figure 3A:
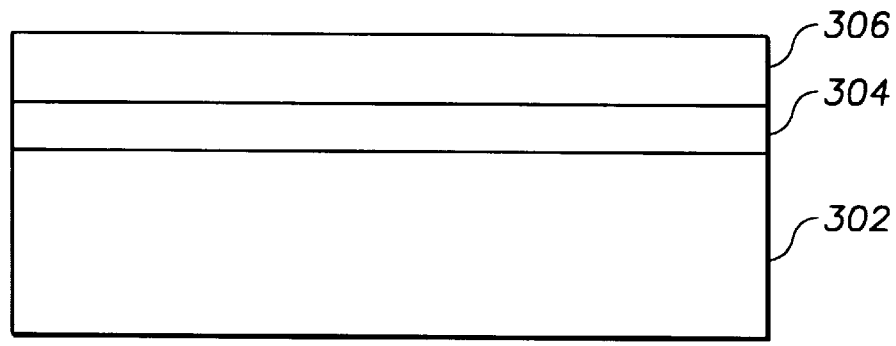
FIGS. 3A–3H illustrate a second exemplary process for making a semiconductor device according to the invention.

FIGS. 3A through 3H illustrate another exemplary process for forming a semiconductor device in accordance with another embodiment of the invention. A first dielectric layer 304 is formed on a substrate 302 and a first gate electrode layer 306 is formed over the first dielectric layer 304, as shown in FIG. 3A. The substrate 302 is typically a semiconductor material, such as, for example, silicon. The first dielectric layer 304 and the first gate electrode layer 306 are formed using the same materials and the same techniques as the first dielectric layer 204 and first gate electrode layer 206 described with respect to FIGS. 2A through 2H.

Figure 3B:
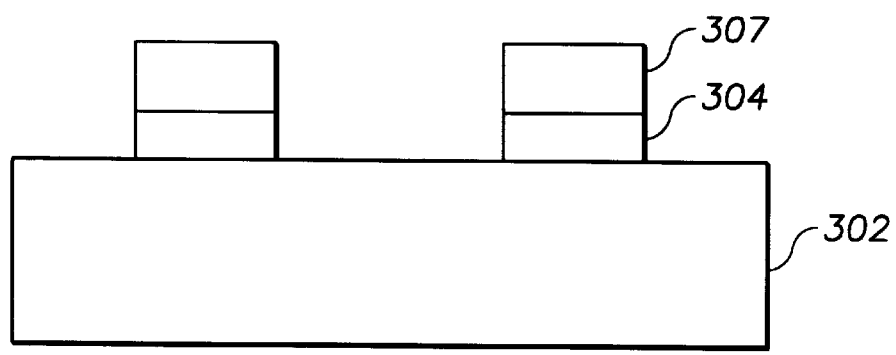

The first gate electrode layer 306 is patterned into one or more first gate electrodes 307, as shown in FIG. 3B. This can be accomplished using photolithographic techniques, as described above with respect to the embodiment illustrated in FIG. 2B. In addition, all of the first dielectric layer 304 in a substrate region between the first gate electrodes 307 is removed simultaneously with or subsequent to the formation of the first gate electrodes 307 to expose the substrate 302 between the first gate electrodes 307, as shown in FIG. 3B. This can be accomplished by a variety of techniques, including, for example, anisotropic etching.

Figure 3C:
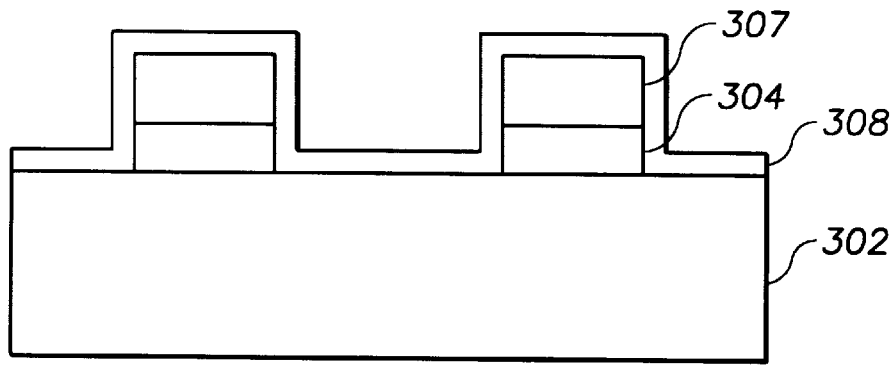
Figure 3D:
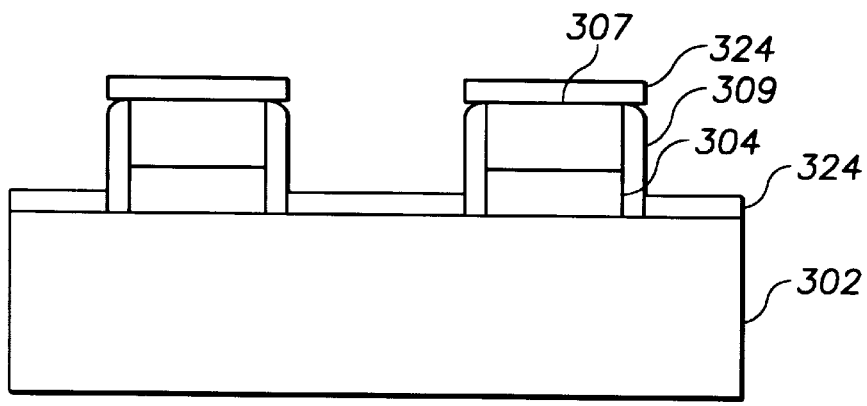

A spacer layer 308 is formed over the exposed substrate 302 and the first gate electrodes 307, as shown in FIG. 3C. The spacer layer 308 is typically formed of the same materials and by the same methods as described with respect to the embodiment illustrated in FIG. 2C. A portion of the spacer layer 308 is removed to form spacers 309 on the sidewalls of the first gate electrodes 307, as shown in FIG. 3D. This exposes a portion of the substrate 302 between the first gate electrodes 307.

A second dielectric layer 324 is formed, at least, between the first gate electrodes 307 and over the exposed surface of the substrate 302, as shown in FIG. 3D. The second dielectric layer 324 can include dielectric materials, such as, for example, high-K dielectric materials (i.e., materials having a dielectric constant of 8 or greater), silicon dioxide, silicon nitride, silicon oxynitride, or nitrided silicon oxide ($SiO_xN_y$). The material of the first dielectric layer 304 and the second dielectric layer 324 may be the same or different. In one embodiment, the thickness and material of the second dielectric layer 324 is chosen to provide a same capacitance for a given area as the first dielectric layer 304. In other embodiments, the thickness and material of the second dielectric layer 324 are chosen to provide a capacitance for a given area that is different than that of the first dielectric layer 304.

The second dielectric layer 324 can be formed by a variety of processes, including, for example, chemical vapor deposition, physical vapor deposition, thermal oxidation of the substrate, or spin-on glass formation. For high-K dielectric materials, the second dielectric layer 324 can have a thickness ranging from, for example, 5 to 50 Angstroms, and usually 5 to 25 Angstroms. The thickness of the second dielectric layer 324 is typically selected in consideration of the desired capacitive characteristics of the layer.

In another embodiment, the second dielectric layer is deposited prior to the formation of the spacer layer and the spacers. This may be particularly useful when the spacer layer is formed by thermal oxidation of the first gate electrode, as the second dielectric layer can prevent oxidation of the exposed portions of the substrate between the first gate electrodes.

Figure 3E:
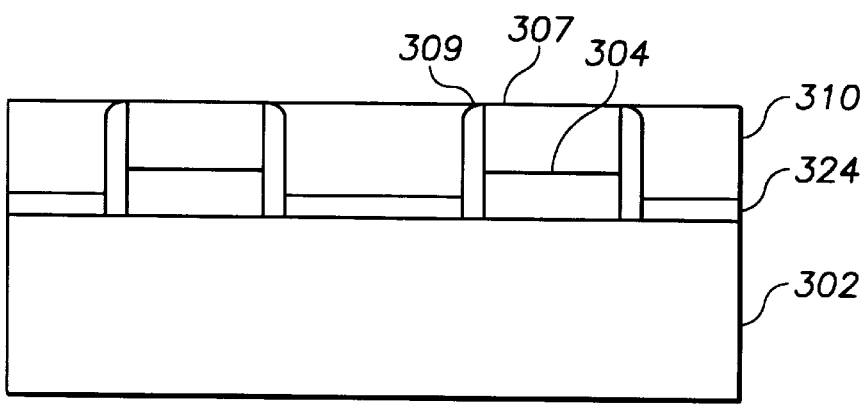
Figure 3F:
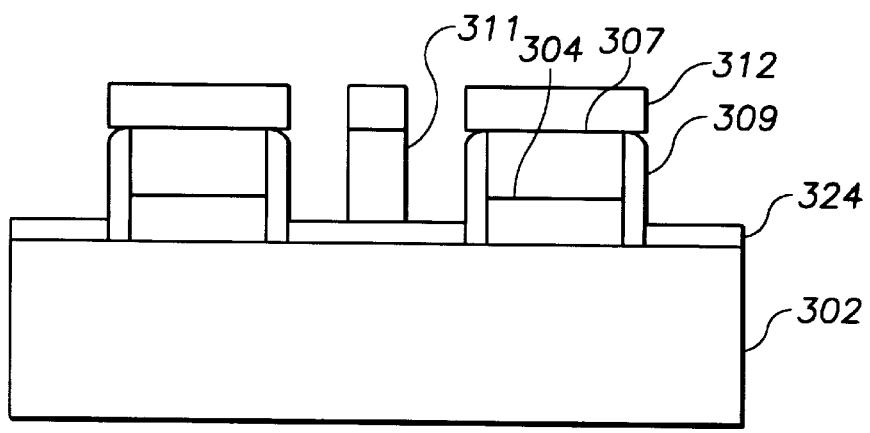
Figure 3G:
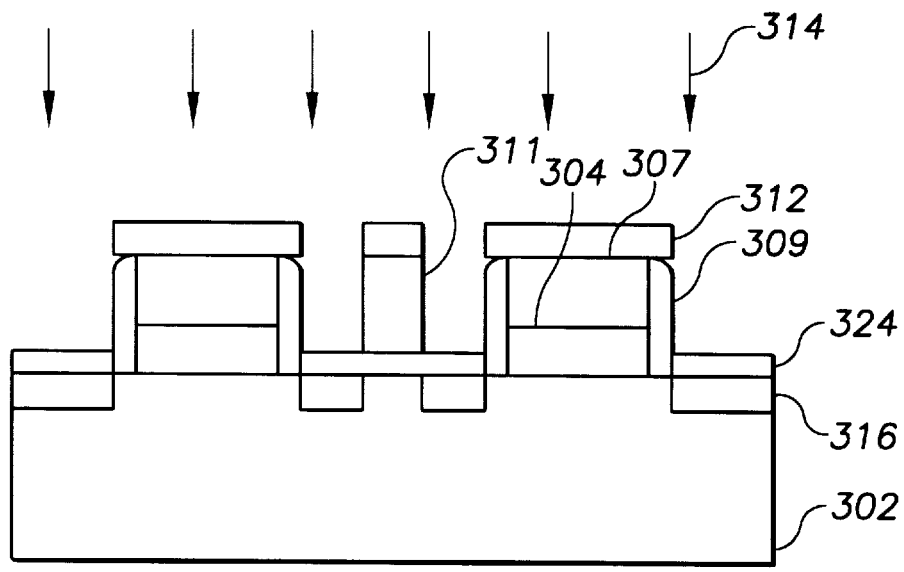
Figure 3H:
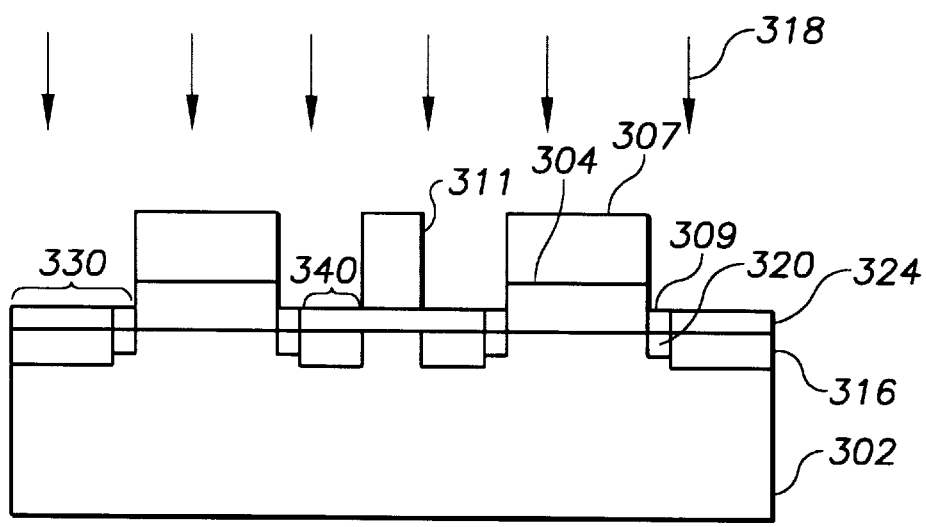

Returning to FIGS. 3A through 3H, the remainder of the process is similar to the process flow described in relation to FIGS. 2E through 2H. A second gate electrode layer 310 is formed between the first gate electrodes 307, as shown in FIG. 3E. A portion of the second gate electrode layer may be formed over the first gate electrodes and this portion, as well as the portion, if any, of the second dielectric layer over the first gate electrodes, may be removed by planarization techniques. A photoresist material 312 is deposited over the first gate electrodes 307 and the second gate electrode layer 310. Portions of the photoresist material 312 and the second gate electrode layer 310 are simultaneously or sequentially removed to form one or more second gate electrodes 311, as shown in FIG. 3F. Following formation of the second gate electrodes 311, the substrate is doped with a first dopant material 314 to form active regions 316, as shown in FIG. 3G. The remainder of the photoresist material 312, if any, and the spacers 309 are removed, as shown in FIG. 3H. The substrate 302 is doped with a second dopant material 318, typically of the same type as the first dopant material 314, to form lightly-doped (LDD) regions 320 adjacent to the first gate electrodes 307.

This process provides structures that can be used to form active devices with LDD source/drain structures 330 and active devices with non-LDD source/drain structures 340 on the same substrate and in an integrated process. Fabrication may continue with well-known processing steps including, for example, silicidation, interlayer dielectric formation, interconnect formation, conducting line formation, and so forth to complete the ultimate device structure. The process illustrated in FIGS. 3A through 3H can also be adapted for formation of both PMOS and NMOS structures in a CMOS device, as described above with respect to the embodiment illustrated in FIGS. 2A through 2H.

The second gate electrodes 311 differ from the first gate electrodes 307 because of the absence of LDD source/drain structures adjacent to the second gate electrodes(s) 311. Moreover, the thickness and/or material of the first dielectric layer 304 under the first gate electrodes 307 is often different from the thickness and/or material of the second dielectric layer 324 under the second gate electrodes 311. In addition, at least in some embodiments, the first and second gate electrodes 307, 311 are formed of different materials. These differences between the first and second gate electrodes 307, 311 typically results in different operational properties for the associated active devices (e.g., transistors).

Figure 4A:
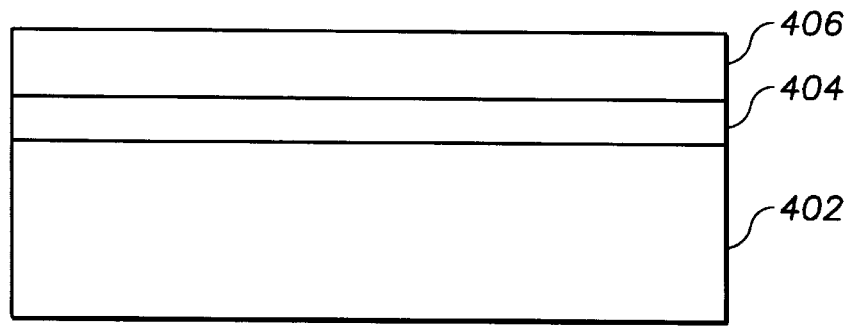
FIGS. 4A–4H illustrate a third exemplary process for making a semiconductor device according to the invention.

FIGS. 4A through 4H illustrate another exemplary process for forming a semiconductor device. A first dielectric layer 404 is formed on a substrate 402 and a first gate electrode layer 406 is formed over the first dielectric layer 404, as shown in FIG. 4A. The substrate 402 is typically a semiconductor material, such as, for example, silicon. The first dielectric layer 404 and the first gate electrode layer 406 are formed using the same materials and the same techniques as the first dielectric layer 204 and first gate electrode layer 206 described with respect to FIGS. 2A through 2H.

Figure 4B:
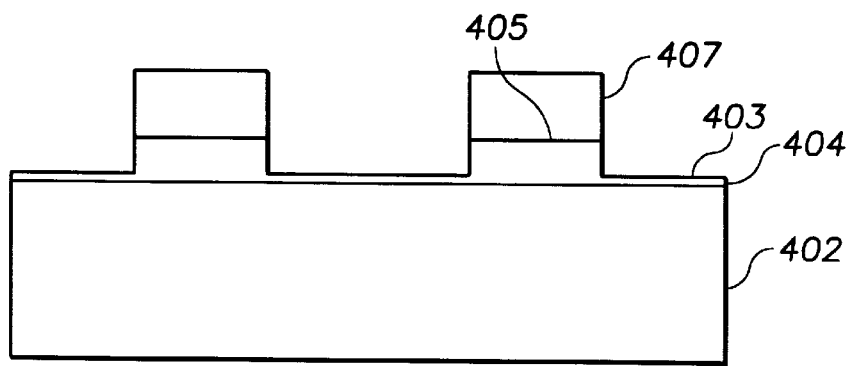

The first gate electrode layer 406 is patterned into one or more first gate electrodes 407, as shown in FIG. 4B. This can be accomplished using photolithographic techniques, as described above with respect to the embodiment illustrate in FIG. 2B. In addition, a portion of the first dielectric layer 404 between the first gate electrodes 407 is also removed simultaneously with or subsequent to the formation of the first gate electrodes 407, as shown in FIG. 4B. This provides thicker regions 405 of the first dielectric layer 404 under the first gate electrodes 407 and thinner regions 403 of the first dielectric layer 404 between and adjacent to the first gate electrodes 407. The thickness of the first dielectric layer 404 in the thinner regions 403 typically ranges from 5 to 50 Angstroms for high-K dielectric materials. The thickness of the thinner regions 403 for other materials is typically selected in consideration of the capacitive characteristics of the layer, taking into account any reliability concerns. The removal of the portions of the first dielectric layer 404 between the first gate electrodes 407 can be accomplished by a variety of techniques, including, for example, anisotropic etching.

Figure 4C:
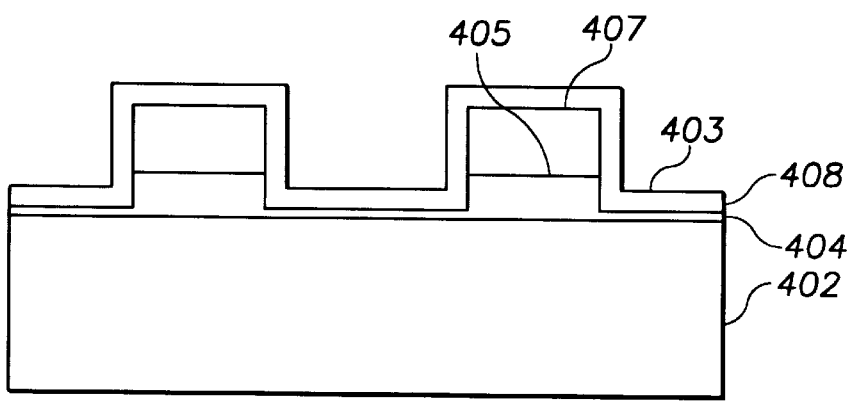
Figure 4D:
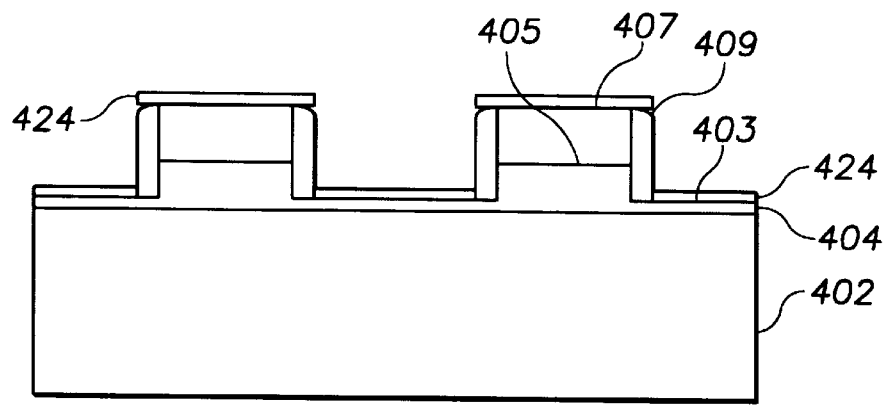

A spacer layer 408 is formed over the exposed second regions 403 of the first dielectric layer 404 and the first gate electrodes 407, as shown in FIG. 4C. The spacer layer 408 is typically formed of the same materials and by the same methods as described with respect to the embodiment illustrated in FIG. 2C. A portion of the spacer layer 408 is removed to form spacers 409 on the sidewalls of the first gate electrodes 407, as shown in FIG. 4D. This exposes the thinner regions 403 of the first dielectric layer 404.

A second dielectric layer 424 is formed between over, at least, the thinner regions 403 of the first dielectric layer 404, as shown in FIG. 4D. In one alternative embodiment, the second dielectric layer is deposited prior to the formation of the spacer layer and the spacers. The formation of the second dielectric layer 424 produces a dielectric stack, including the first and second dielectric layers 404, 424, between the first gate electrodes. The second dielectric layer 424 can include dielectric materials, such as, for example, high-K dielectric materials (e.g., materials having a dielectric constant of 8 or greater), silicon dioxide, silicon nitride, silicon oxynitride, or nitrided silicon oxide ($SiO_xN_y$). The material of the first dielectric layer 404 and the second dielectric layer 424 may be the same or different. In one embodiment, the thickness and material of the dielectric stack (including the second dielectric layer 424 and the underlying first dielectric layer 404) is chosen to provide a same capacitance for a given area as the first dielectric layer 404 under the first gate electrodes 407. In other embodiments, the thickness and material of the dielectric stack (including the second dielectric layer 424 and the underlying first dielectric layer 404) is chosen to have a different capacitance for a given area than the first dielectric layer 404 under the first gate electrodes 407.

The second dielectric layer 424 can be formed by a variety of processes, including, for example, chemical vapor deposition, physical vapor deposition, thermal oxidation of the substrate, or spin-on glass formation. For high-K dielectric materials, the second dielectric layer 424 can have a thickness ranging from, for example, 5 to 25 Angstroms, and usually 5 to 15 Angstroms. The thickness of the first dielectric layer 204 for other materials is typically selected in consideration of the capacitive characteristics of the layer, taking into account any reliability concerns.

Figure 4E:
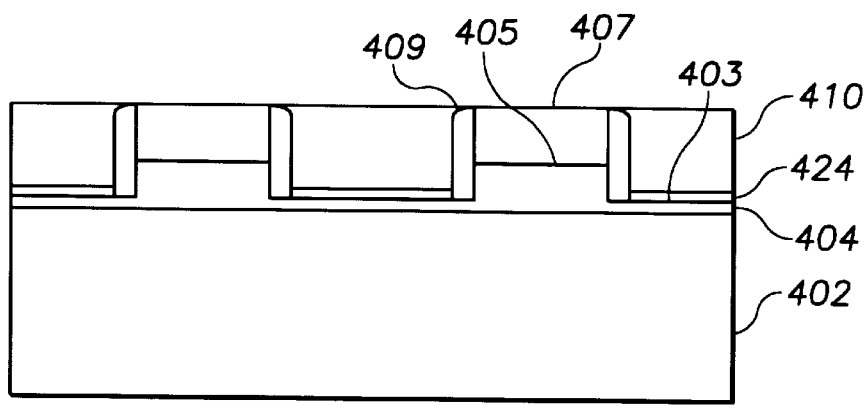
Figure 4F:
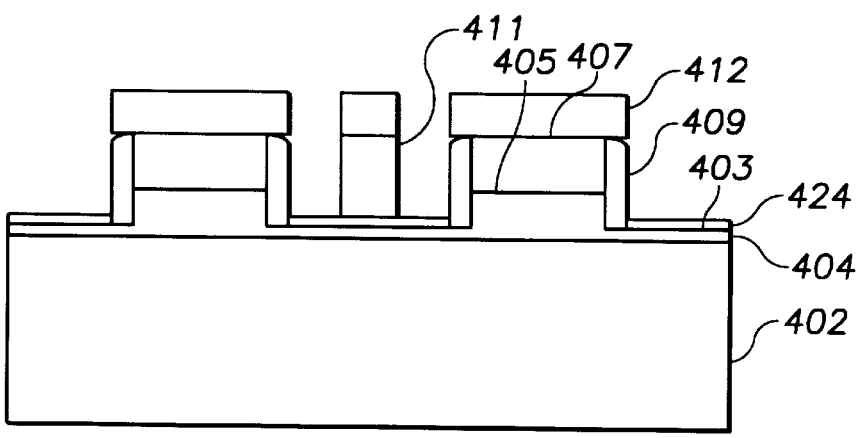
Figure 4G:
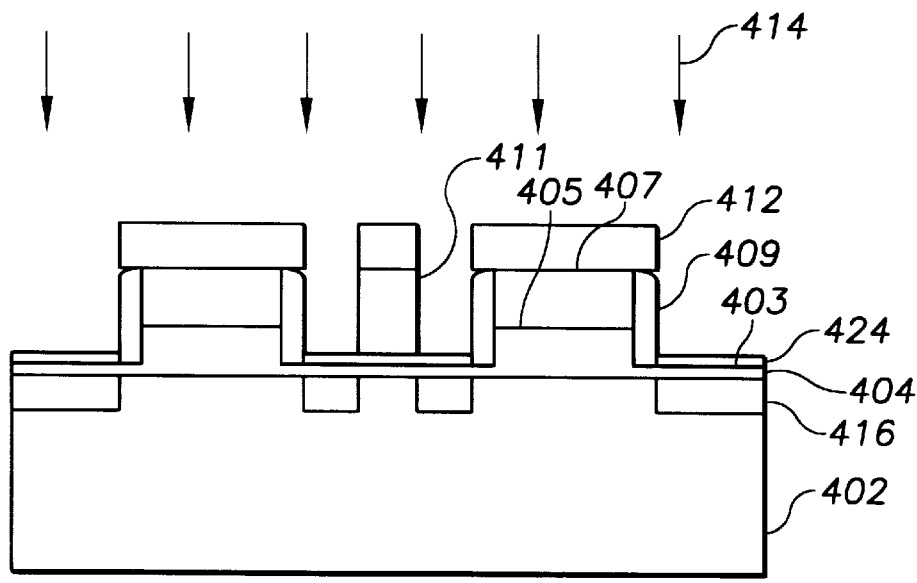
Figure 4H:
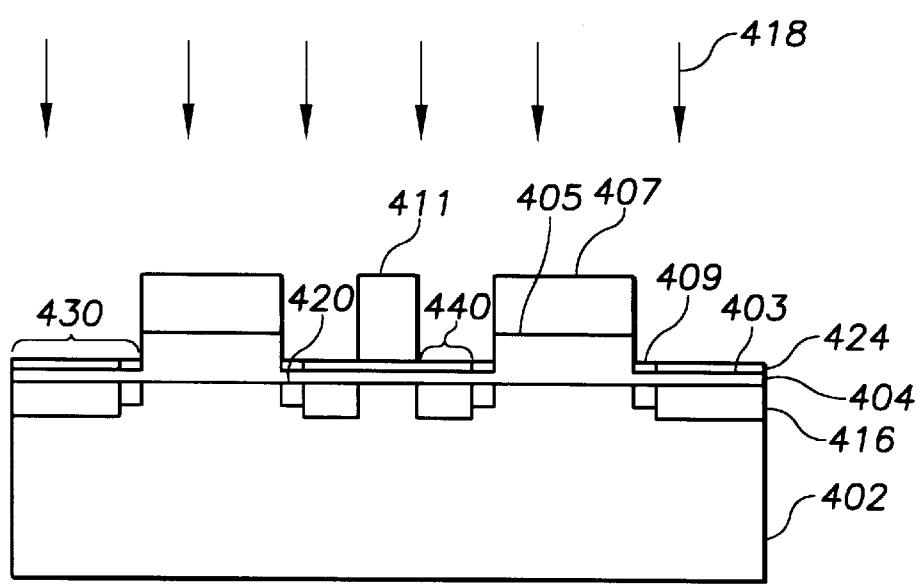

Returning to FIGS. 4A through 4H, the remainder of the process is similar to the process flow described in relation to FIGS. 2E through 2H. A second gate electrode layer 410 is formed between the first gate electrodes 407, as shown in FIG. 4E. A portion of the second gate electrode layer may be formed over the first gate electrodes and this portion, as well as the portion, if any, of the second dielectric layer over the first gate electrodes, may be removed by planarization techniques. A photoresist material 412 is deposited over the first gate electrodes 407 and the second gate electrode layer 410. Portions of the photoresist material 412 and the second gate electrode layer 410 are simultaneously or sequentially removed to form one or more second gate electrodes 411, as shown in FIG. 4F. Following formation of the second gate electrodes 411, the substrate is doped with a first dopant material 414 to form active regions 416, as shown in FIG. 4G. The remainder of the photoresist material 412, if any, and the spacers 409 are removed, as shown in FIG. 4H. The substrate 402 is doped with a second dopant material 418, typically of the same type (either n-type or p-type) as the first dopant material 414, to form lightly-doped (LDD) regions 420 adjacent to the first gate electrodes 407.

This process provides active devices with LDD source/drain structures 430 and active devices with non-LDD source/drain structures 440 on the same substrate and in an integrated process. Fabrication may continue with well-known processing steps including, for example, silicidation, interlayer dielectric formation, interconnect formation, conducting line formation, and so forth to complete the ultimate device structure. The process illustrate in FIGS. 4A through 4H can also be adapted for formation of both PMOS and NMOS structures in a CMOS device, as described above with respect to the embodiment illustrate in FIGS. 2A through 2H.

The second gate electrodes 411 differ from the first gate electrodes 407 because of the absence of LDD structures adjacent to the second gate electrodes 411. Moreover, the thickness and/or material of the first dielectric layer 404 under the first gate electrodes 407 is different from the thickness and/or material of the dielectric stack of the first and second dielectric layers 404, 424 under the second gate electrodes 411. In addition, at least in some embodiments the first and second gate electrodes 407, 411 are formed of different materials. These differences between the first and second gate electrodes 407, 411 typically result in different operational properties for the associated active devices (e.g., transistors).

Another exemplary process is illustrated in FIGS. 5A to 5E. In this process, an isolation region 550 is formed in the substrate 502. The isolation region can be formed using, for example, known trench isolation or LOCOS isolation techniques. Typically, the isolation region includes a dielectric material formed in the substrate to separate active devices (e.g., transistors). The process then proceeds as illustrated in FIGS. 3A to 3H, except that subsequently formed first and second gate electrodes are separated by the isolation region 550.

Figure 5A:
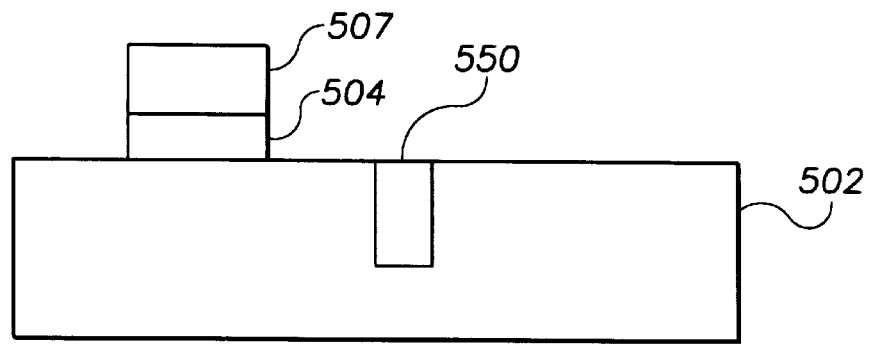
FIGS. 5A–5E illustrate a fourth exemplary process for making a semiconductor device according to the invention.
Figure 5B:
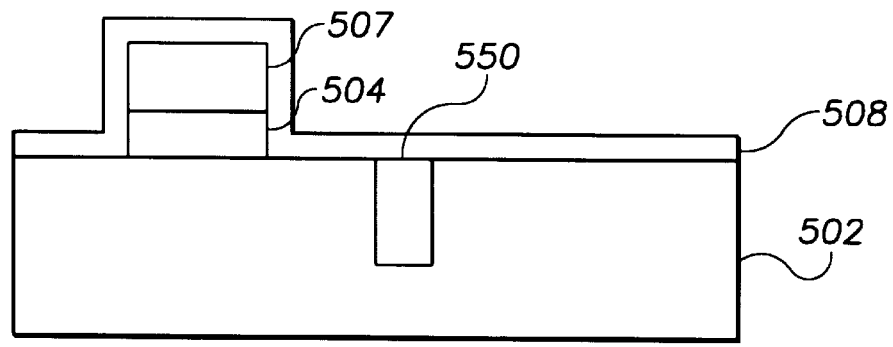
Figure 5C:
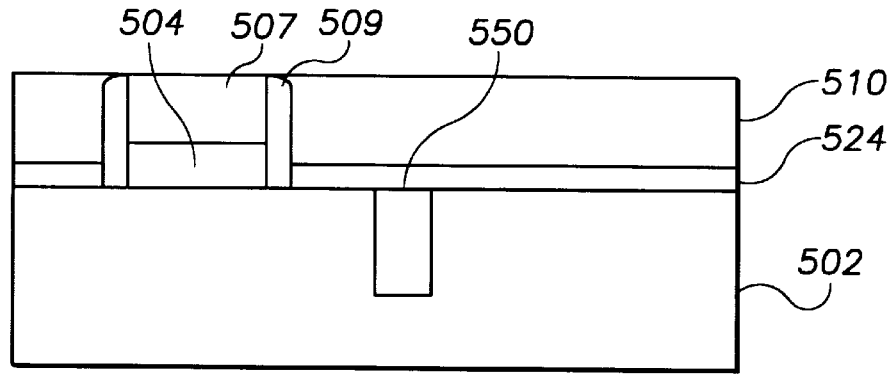
Figure 5D:
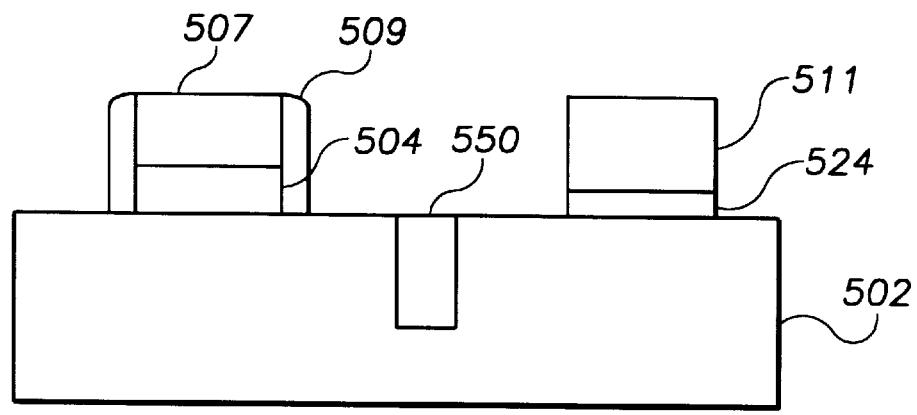
Figure 5E:
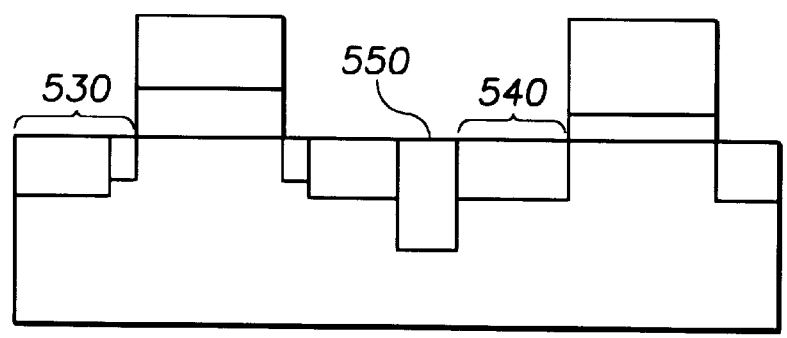

A first dielectric layer 504 is formed over the substrate and a first gate electrode 507 is formed over the first dielectric layer 504, as illustrated in FIG. 5A. A spacer layer 508 is formed over the substrate 502 and the first gate electrode 507, as shown in FIG. 5B. Spacers 509 are formed from the spacer layer 508 and a second dielectric layer 524 and second gate electrode layer 510 then sequentially are formed, as shown in FIG. 5C. A second gate electrode 511 is formed from the second gate electrode layer 510, as shown in FIG. 5D. The substrate is then doped with a first dopant material to form active regions 516 adjacent to the second gate electrode 511 and the spacers 509 on the first gate electrode 507, as shown in FIG. 5E. The spacers 509 are then removed and the substrate is doped with a second dopant material to form lightly-doped regions 520 adjacent to the first gate electrode 507.

This process flow provides active devices with LDD source/drain structures 530 that are separated by isolation regions from active devices with non-LDD source/drain structures 540. A similar modification, i.e., the addition of an isolation region between the first and second gate electrodes, can be made to the process flows illustrated in FIGS. 2A to 2H and in FIGS. 4A to 4H. Other alternative embodiments include modifying the process flows to provide isolation regions between only selected adjacent active devices.

Figure 6A:
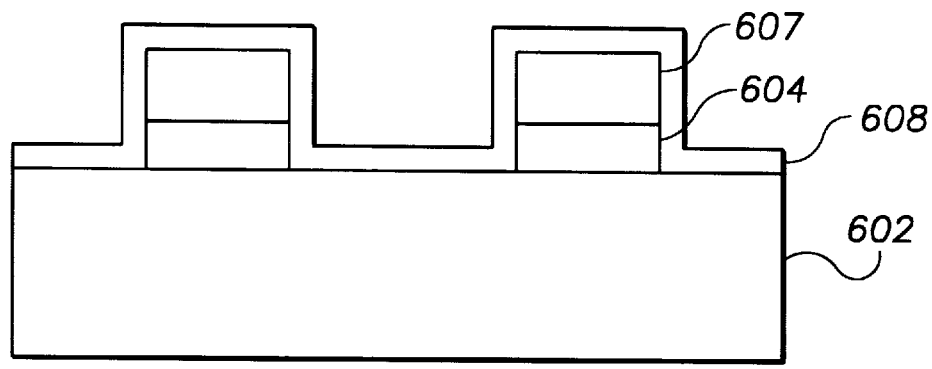
FIGS. 6A–6C illustrate a fifth exemplary process for making a semiconductor device according to the invention.
Figure 6B:
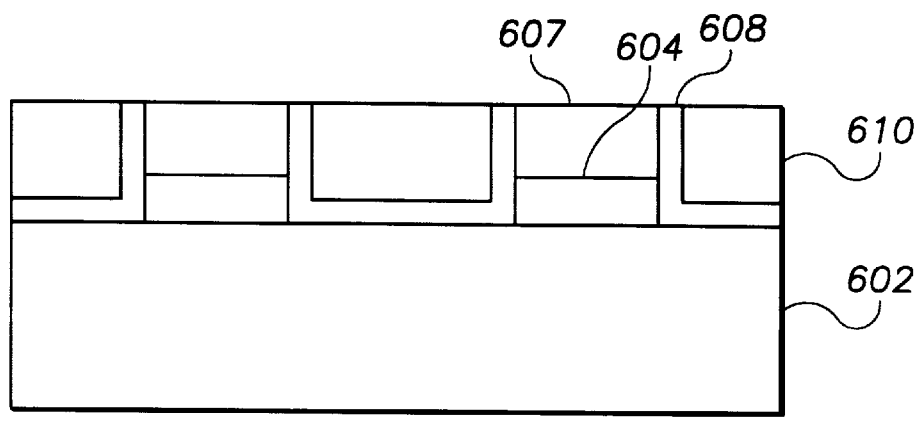
Figure 6C:
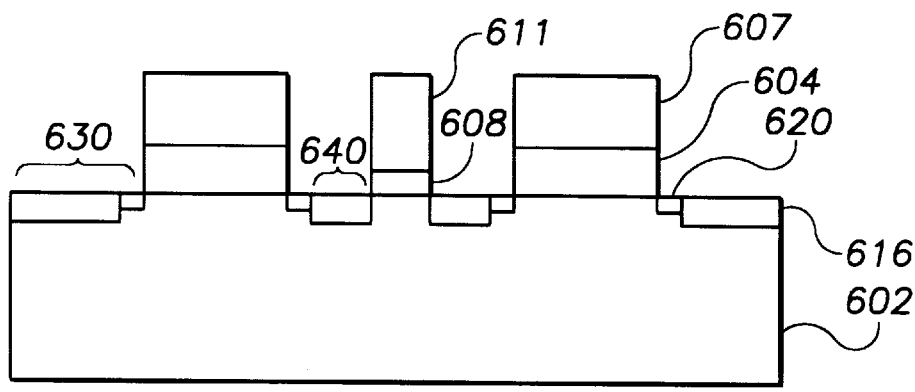

Another exemplary process flow is illustrated in FIGS. 6A to 6C, in which a spacer layer is used to form a gate dielectric for the second gate electrodes. In this process flow, a first dielectric layer 604 and first gate electrode layer are formed over the substrate 602 and patterned to form first gate electrodes 607. A spacer layer 608 is formed over the substrate 602 and the first gate electrodes 607, as shown in FIG. 6A. Next, a second gate electrode layer 610 is formed over the spacer layer 608 and the first gate electrode 607, as shown in FIG. 6B. Portions of the second gate electrode layer 610 are removed to form second gate electrodes 611. The substrate is then doped to form active regions 616 adjacent to the second gate electrodes 611 and spaced apart from the first gate electrodes 607. The spacer layer 608 is then removed except for the portion beneath the second gate electrodes 611, which forms a gate dielectric, and the substrate is doped to form lightly-doped regions 620 adjacent to the first gate electrodes 607. This structure is illustrated in FIG. 6C. Additional processing may then be performed to complete the ultimate device structure that includes active devices with LDD source/drain structures 630 and active devices with non-LDD source/drain structures 640 on the same substrate.

The process flow illustrated in FIGS. 4A to 4H can be similarly modified to produce a dielectric stack underneath the second gate electrodes that is formed from the first dielectric layer and the spacer layer. These particular process flows may be useful if the spacer layer is formed using a material and a thickness suitable for forming a gate dielectric layer for the second gate electrodes that has the desired capacitive properties.

As noted above, the present invention is applicable to a number of different devices and systems where active devices with LDD source/drain structures and active device with non-LDD source/drain structures and/or active devices with different gate dielectrics are provided on the same substrate. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A method of forming a semiconductor device comprising:
    forming a first gate electrode over a substrate;
    forming a spacer on at least one sidewall of the first gate electrode;
    forming a second gate electrode over the substrate after forming the spacer;
    implanting a first dopant into the substrate to form a first heavily doped active region adjacent to the spacer and spaced from the first gate electrode and a second heavily doped active region adjacent to the second gate electrode;
    removing the spacer; and
    implanting a second dopant into the substrate after removing the spacer to a form a lightly doped active region adjacent to the first gate electrode.

2. The method of claim 1, wherein forming the spacer comprises forming a conformal spacer layer on at least one sidewall of the first gate electrode.

3. The method of claim 1, further comprising forming a first dielectric layer over the substrate prior to forming the first gate electrode.

4. The method of claim 3, further comprising forming the second gate electrode over the first dielectric layer.

5. The method of claim 4, further comprising removing a portion of the first dielectric layer to leave a thinner portion of the first dielectric layer, the second gate electrode being formed over the thinner portion of the first dielectric layer.

6. The method of claim 5. further comprising forming a second dielectric layer over the substrate and forming the second gate electrode over the second dielectric layer.

7. The method of claim 3, further comprising removing a portion of the first dielectric layer to expose a portion of the substrate, forming a second dielectric layer on the exposed portion of the substrate, and forming the second gate electrode over the second dielectric layer.

8. The method of claim 1, wherein forming the spacer comprises forming a spacer layer over the first gate electrode and the substrate.

9. The method of claim 8, wherein forming the second gate electrode comprises forming the second gate electrode over a portion of the spacer layer.

10. The method of claim 1, wherein forming the first gate electrode comprises forming a first gate electrode layer over the substrate and removing a portion of the first gate electrode layer to form the first gate electrode.

11. The method of claim 1, wherein forming the second gate electrode comprises forming a second gate electrode layer over the substrate and removing a portion of the second gate electrode layer adjacent to the spacer to form the second gate electrode.

12. The method of claim 1, wherein the first gate electrode and the second gate electrode have a common active region comprising at least a portion of the first heavily doped active region and at least a portion of the second heavily doped active region.

13. A method of forming a semiconductor device comprising:

forming a first gate electrode structure over a substrate, the gate electrode structure including a gate electrode layer over a gate dielectric layer in vertical alignment;

forming a spacer on at least one sidewall of the first gate electrode structure, the spacer in contact with the gate electrode layer and a portion of the gate dielectric layer;

forming a second gate electrode structure over the substrate after forming the spacer;

implanting a first dopant into the substrate to form a first heavily doped active region adjacent to the spacer and spaced from the first gate electrode structure and a second heavily doped active region adjacent to the second gate electrode structure;

removing the spacer; and implanting a second dopant into the substrate after removing the spacer to a form a lightly doped active region adjacent to the first gate electrode structure.

14. The method of claim 13, wherein the first and second gate electrode structures have gate electrode layers that differ in thickness and have gate dielectric layers that differ in thickness.

15. The method of claim 14, wherein the step of forming the first gate electrode structure includes forming at least two first gate electrode structures whereby the second gate electrode structure is formed between the two first gate electrode structures.

16. The method of claim 13, after the step of forming the first electrode structure, further including the step of forming a trench isolation region adjacent the first electrode structure, whereby the trench isolation region is formed between the first and second gate electrode structures.

17. The method of claim 13, wherein forming the spacer comprises forming a spacer layer over the first gate electrode structure and on the substrate.

18. The method of claim 17, wherein forming the second gate electrode structure comprises forming the second gate electrode structure with a portion of the spacer layer.

19. The method of claim 13, further comprising forming a first dielectric layer over the substrate prior to forming the first gate electrode structure.

20. The method of claim 19, further comprising forming the second gate electrode structure over the first dielectric layer.

21. The method of claim 20, further comprising removing a portion of the first dielectric layer to leave a thinner portion of the first dielectric layer, the second gate electrode structure being formed from a part of the thinner portion of the first dielectric layer.

22. The method of claim 20, further comprising forming a second dielectric layer on the thinner portion of the first dielectric layer and forming a third gate electrode structure with a part of the second dielectric layer.

23. The method of claim 19, further comprising removing a portion of the first dielectric layer to expose a portion of the substrate, forming a second dielectric layer on the exposed portion of the substrate and forming the second gate electrode structure with a part of the second dielectric layer.

24. The method of claim 13, wherein the first gate electrode structure and the second gate electrode structure have a common active region comprising at least a portion of the first heavily doped active region and at least a portion of the second heavily doped active region.

25. The method of claim 12, wherein the step of forming the second dielectric layer includes forming the second dielectric layer in direct contact with the first dielectric layer after forming the spacer.

* * * * *

UNITED STATES PATENT AND TRADEMARK OFFICE
CERTIFICATE OF CORRECTION

PATENT NO. : 6,309,936 B1
DATED : October 30, 2001
INVENTOR(S) : Gardner et al.

It is certified that error appears in the above-identified patent and that said Letters Patent is hereby corrected as shown below:

<u>Column 12,</u>
Line 40, "claim 5." should read -- claim 5, --.

Signed and Sealed this

Twenty-sixth Day of March, 2002

*Attest:*

*Attesting Officer*

JAMES E. ROGAN
*Director of the United States Patent and Trademark Office*